United States Patent [19]

Nyul

[11] 4,380,862
[45] Apr. 26, 1983

[54] METHOD FOR SUPPLYING A LOW RESISTIVITY ELECTRICAL CONTACT TO A SEMICONDUCTOR LASER DEVICE

[75] Inventor: Paul Nyul, Lancaster, Pa.

[73] Assignee: RCA Corporation, New York, N.Y.

[21] Appl. No.: 322,007

[22] Filed: Nov. 16, 1981

[51] Int. Cl.³ .................. H01L 21/28; H01L 21/302; H01L 21/58; H01S 3/19
[52] U.S. Cl. .................. 29/569 L; 29/583; 29/589; 29/591; 357/71; 372/44
[58] Field of Search .................. 29/569 L, 583, 589, 29/591; 357/71, 81; 372/44–50

[56] References Cited

U.S. PATENT DOCUMENTS

| | | | |
|---|---|---|---|
| 3,341,937 | 9/1967 | Dill, Jr. .................. | 29/583 |
| 3,471,923 | 10/1969 | Lamorte et al. .................. | 29/572 |
| 3,747,016 | 7/1973 | Kressel et al. .................. | 331/94.5 |
| 3,753,801 | 8/1973 | Lockwood et al. .................. | 148/171 |
| 3,787,958 | 1/1974 | Freedman et al. .................. | 29/472.3 |
| 4,116,733 | 9/1978 | Olsen et al. .................. | 148/175 |
| 4,237,601 | 12/1980 | Woolhouse et al. .................. | 29/569 L X |

Primary Examiner—L. Dewayne Rutledge
Assistant Examiner—Alan E. Schiavelli
Attorney, Agent, or Firm—Birgit E. Morris; Donald S. Cohen

[57] ABSTRACT

The invention is an improved method of fabricating a semiconductor laser which comprises bonding an electrically conducting sheet to a metallized surface of a strip of semiconductor material prior to separating the strip into one or more laser chips. The invention provides a simplified method of fabricating a laser having reduced resistive heating in the contact and improved uniformity of electrical current flow.

7 Claims, 4 Drawing Figures

METHOD FOR SUPPLYING A LOW RESISTIVITY ELECTRICAL CONTACT TO A SEMICONDUCTOR LASER DEVICE

The invention relates to a method of making a semiconductor laser having reduced resistive heating in an electrical contact and a more uniform current flow.

BACKGROUND OF THE INVENTION

A semiconductor laser is typically fabricated by depositing one or more layers of material on a substrate to form a wafer, metallizing two major surfaces of the wafer, cleaving a strip of material from the wafer and then sawing the strip at right angles to the cleavage faces to form laser chips. The laser chip may be composed of a single layer of the same or different material than that of the substrate and having a different conductivity type from that of the substrate to form a single homojunction or heterojunction device, respectively. Alternatively, the chip may be composed of a pair of confinement layers with an active layer therebetween to form a double heterostructure laser as disclosed, for example, by Kressel et al. in U.S. Pat. No. 3,747,016, incorporated herein by reference. The laser chip is then typically mounted by soldering or thermocompression bonding one of the metal layers to a metal header or to a metallized ceramic body with the electrical contact being made over the entire metal layer. The second contact to the laser chip is typically made by bonding a lead wire to the second metal layer. In this case the current enters the second metal layer in a small portion of its area and flows laterally along the metal layer before entering the device. A problem arises with this second contact in that the metal layer must be thin enough so that the strip can be cleaved from the wafer but thick enough to have sufficient current carrying capacity. We have found that, particularly for high power pulsed lasers, such as that disclosed by M. F. Lamorte in U.S. Pat. No. 3,471,923, incorporated herein by reference, that a laser fabricated in this manner fails either because resistance heating of the metal layer produces an opening in the metal layer, heats the device or produces a spatially nonuniform current flow across the p-n junction.

It would be desirable, to provide a method of fabricating a semiconductor laser which reduces or eliminates these problems.

SUMMARY OF THE INVENTION

The invention is an improved method of fabricating a semiconductor laser which comprises bonding a sheet of an electrical conductor to a metal layer on a strip of a semiconductor material after cleaving from a wafer and prior to separating the strip into one or more laser chips.

DETAILED DESCRIPTION OF THE INVENTION

Figure 1:
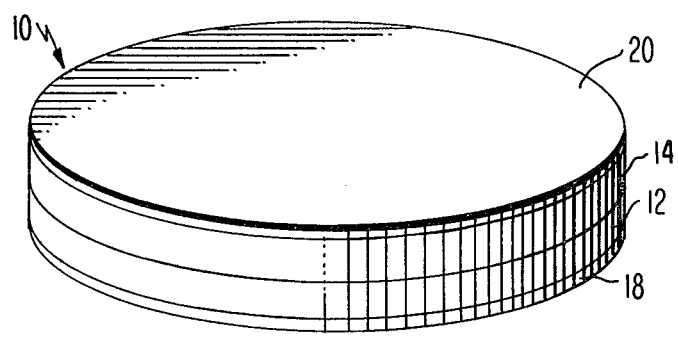
FIG. 1 is a plan view of a metallized semiconductor wafer.

Referring to FIG. 1 a semiconductor wafer 10 includes a region of n-type conductivity 12, a region of p-type conductivity 14 overlying a surface of the n-type region 12 with a p-n junction 16 therebetween. A first metal contact 18 overlies the opposed surface of the n-type region 12 and a second metal contact 20 overlies a surface of p-type region 14.

The semiconductor wafer 10 may be composed of Group III-V materials such as GaAs and AlGaAs alloys or, alternatively, InP and InGaAsP alloys. Typically, one or more layers of GaAs and/or AlGaAs alloys are deposited on a GaAs substrate wherein the substrate and one or more layers have one conductivity type and the remaining layers have the opposite conductivity type.

The semiconductor layers may be deposited using liquid phase epitaxy such as is disclosed by H. F. Lockwood et al. in U.S. Pat. No. 3,753,801, incorporated herein by reference, or by vapor phase epitaxy as disclosed by G. H. Olsen et al. in U.S. Pat. No. 4,116,733, incorporated herein by reference.

The first metal contact 18 to the n-type region 12 may be composed of tin, nickel and gold and the second metal contact to the p-type region 14 may be composed of zinc, nickel and gold. In each case the metals can be deposited sequentially by vacuum evaporation to a thickness of between about 0.3 and 1 micrometer ($\mu$m).

The identification of the elements common to FIG. 1 and the remaining figures is the same.

Figure 2:
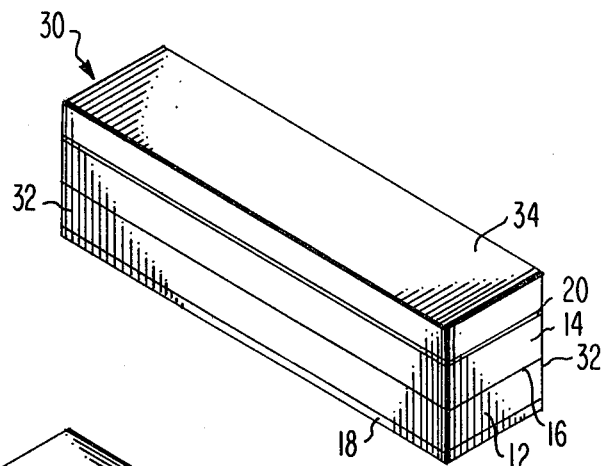
FIG. 2 is a plan view of a strip cleaved from the metallized semiconductor wafer.

Referring to FIG. 2, the wafer 10 is cleaved using techniques standard in the art to produce a strip 30 of semiconductor material having a pair of opposed cleavage faces 32 which are partially transmissive of light at the wavelength emitted by the assembled semiconductor laser. An electrically conducting sheet 34 is then electrically and mechanically bonded to the second electrical contact 20 using a technique such as soldering or thermocompression bonding. The sheet 34 may be soldered to the second electrical contact 20 using a solder such as tin-lead, gold-germanium, gold-tin or gold-silicon depending upon the temperatures to which the device will be exposed. The sheet 34 may be composed of a metal such as nickel, gold, tin or copper and is typically greater than 10 $\mu$m and preferably between about 10 and +$\mu$m thick. If it is composed of a material other than gold the sheet preferably has a thin coating of gold.

Figure 3:
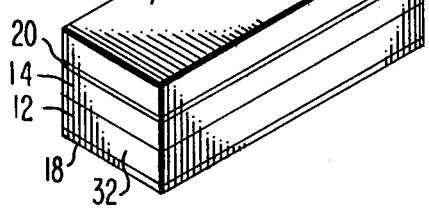
FIG. 3 is a plan view of a laser chip from the strip of semiconductor material.

Referring to FIG. 3, the strip 30 is then separated into one or more chips 40 in a direction perpendicular to the cleavage faces 32 using a technique such as sawing which is well-known in the art.

Figure 4:
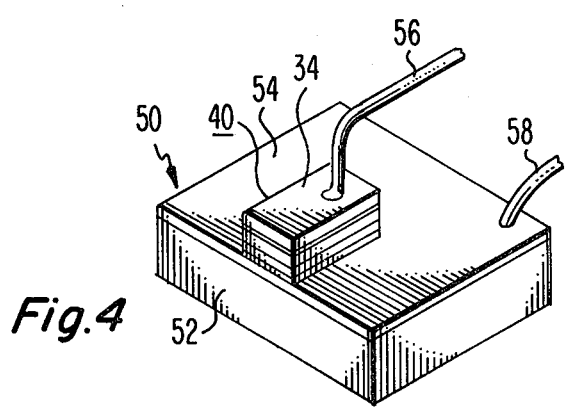
FIG. 4 is a plan view of a mounted semiconductor laser.

Referring to FIG. 4, a semiconductor laser 50 is then assembled by electrically and mechanically bonding the chip 40 to a support 52 having an electrically conducting surface 54 by using well-known techniques such as soldering or thermocompression bonding. The support 52 may be an electrically conducting material such as copper or it may be an electrical insulator such as beryllium oxide. The electrically conducting surface 54 may be composed of layers of nickel and gold sequentially deposited by vacuum evaporation onto the surface of the support 52.

Electrical contact to the laser 50 is made by bonding an electrical lead 56 to the electrically conducting sheet 34 and by bonding an electrical lead 58 to the electrically conducting surface 54.

An improved array of electrically isolated lasers on a single support may be fabricated using the method of the invention by electrically and mechanically bonding the cleaved slice 30 to an electrically insulating support having an electrically conducting surface. The slice is then cut into a plurality of chips with each cut extending through the electrically conducting surface and into the support. Electric leads may then be attached to the electrically conducting sheet and to the portion of the electrically conducting surface to which each chip is bonded.

The invention lies in electrically and mechanically bonding a sheet of a material having a low electrical resistivity to an electrical contact of the slice prior to the separating step. Since the slice is comparatively large the bonding can be made simply and accurately. In the fabrication of a laser array this method provides a single step method for supplying a low resistivity electrical contact to each device.

The utility of the invention lies in providing a low electrical resistivity path in parallel with the contact layer for the flow of electrical current across the surface of the chip thereby reducing or eliminating resistive heating of the chip and increasing the uniformity of the electrical current flow across the chip.

I claim:

1. In a method of fabricating a semiconductor laser comprising the steps of forming a wafer of semiconductor material having regions of opposite conductivity type therein with a p-n junction therebetween; metallizing a pair of surfaces of the wafer, each surface adjacent to a region of a different conductivity type; cleaving the wafer to form a strip of semiconductor material having a pair of opposed cleavage faces perpendicular to said metallized surfaces; separating the strip in a direction perpendicular to said cleavage faces to form a laser chip of the semiconductor material; bonding a first metallized surface of the chip to an electrically conducting surface of a support; and contacting an electrically conducting lead to a second metallized surface of said chip; the improvement comprising the steps of bonding an electrically conducting sheet to the second metallized surface of said strip prior to the separating step and contacting the electrically conducting lead to the electrically conducting sheet.

2. The method of claim 1 wherein the step of bonding the slice to the electrically conducting surface of the support is done prior to the separating step and wherein the separating step forms chips bonded to isolated portions of the electrically conducting surface.

3. The method of claims 1 or 2 wherein the electrically conducting sheet is greater than about 10 micrometers thick.

4. The method of claim 3 wherein the electrically conducting sheet is between about 10 and 30 micrometers thick.

5. The method of claim 3 wherein said electrically conducting sheet is composed of a material selected from the group consisting of gold, copper, nickel and tin.

6. The method of claim 3 wherein the said electrically conducting sheet is composed of nickel.

7. The method of claim 3 wherein the step of bonding the electrically conducting sheet to the second metallized surface comprises soldering the electrically conducting sheet to the second metallized surface.

* * * * *